United States Patent
Emoto

(10) Patent No.: US 6,593,648 B2
(45) Date of Patent: Jul. 15, 2003

(54) SEMICONDUCTOR DEVICE AND METHOD OF MAKING THE SAME, CIRCUIT BOARD AND ELECTRONIC EQUIPMENT

(75) Inventor: Yoshiaki Emoto, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/941,864

(22) Filed: Aug. 30, 2001

(65) Prior Publication Data

US 2002/0030252 A1 Mar. 14, 2002

(30) Foreign Application Priority Data

Aug. 31, 2000 (JP) ........................ 2000-263669
Aug. 30, 2001 (JP) ........................ 2001-261175

(51) Int. Cl.[7] ............................................. H01L 23/48
(52) U.S. Cl. ..................... 257/696; 257/668; 257/666; 257/676; 257/735; 257/688; 257/738; 257/692; 257/693; 257/773
(58) Field of Search .................... 257/666, 668, 257/676, 735, 736, 690, 688, 738, 692, 669, 693, 696, 773, 774, 778

(56) References Cited

U.S. PATENT DOCUMENTS

| | | | | |
|---|---|---|---|---|
| 4,278,991 A | * | 7/1981 | Ritchie et al. | 257/696 |
| 4,460,825 A | * | 7/1984 | Haghiri-Tehrani et al. | 174/52.4 |
| 4,873,615 A | * | 10/1989 | Grabbe | 174/52.4 |
| 5,923,538 A | * | 7/1999 | Hawthorne | 257/692 |
| 6,049,128 A | * | 4/2000 | Kitano et al. | 228/180.22 |

FOREIGN PATENT DOCUMENTS

| JP | 5-235091 | 9/1993 |
|---|---|---|
| JP | 5-291361 | 11/1993 |
| JP | 7-153793 | 6/1995 |
| JP | 7-201912 | 8/1995 |
| JP | 10-107198 | 4/1998 |

* cited by examiner

Primary Examiner—Nathan J. Flynn
Assistant Examiner—Pershelle Greene
(74) Attorney, Agent, or Firm—Oliff & Berridge, PLC

(57) ABSTRACT

A method of manufacturing a semiconductor device includes a step of providing a semiconductor chip having electrodes to face a tape having a plurality of first holes, a support member surrounded by the first holes, and leads extending across the first holes to the support member; a step of bonding the electrodes to the leads; a step of cutting the leads in the first holes; and a step of bending the leads to go around a lateral portion of the support member.

14 Claims, 9 Drawing Sheets

SEMICONDUCTOR DEVICE AND METHOD OF MAKING THE SAME, CIRCUIT BOARD AND ELECTRONIC EQUIPMENT

Japanese Patent Application No. 2000-263669, filed Aug. 31, 2000, and Japanese Patent Application No. 2001-261175, filed Aug. 30, 2001 are hereby incorporated by reference in their entirety.

FIELD OF THE INVENTION

The present invention relates to a semiconductor device and method of manufacture thereof, a circuit board, and an electronic instrument.

BACKGROUND

When high-density mounting is required of semiconductor devices, bare chip mounting is ideal. However, a bare chip presents problems of quality assurance and handling. In response to this, semiconductor devices have been developed to which CSP (Chip Scale/Size Package) is applied. There is no formal definition of CSP, but generally it is understood to refer to an IC package with a package size the same as an IC chip, or very slightly larger than an IC chip. To advance high-density mounting, the development of CSP technology is important.

In the development of semiconductor devices, it is also important to realize a construction which effectively absorbs thermal stress. Thermal stress arises from the difference in the coefficient of thermal expansion between the semiconductor device and the circuit board on which the semiconductor device is mounted. Conventionally, to absorb this thermal stress, it is known to provide an elastic resin. However, to further improve the reliability of the semiconductor device, yet more effective stress absorption is required.

SUMMARY OF THE INVENTION

A method of manufacturing a semiconductor device according to the present invention comprises the steps of:
  providing a semiconductor chip having electrodes to face a tape having a plurality of first holes, a support member surrounded by the first holes, and leads extending across the first holes to the support member;
  bonding the electrodes to the leads;
  cutting the leads in the first holes; and
  bending the leads into go around a lateral portion of the support member.

Another method of manufacturing a semiconductor device according to the present invention comprises the steps of:
  providing a semiconductor chip having electrodes to face a tape having a plurality of first holes, a support member surrounded by the first holes and having a second hole, and leads extending across the first holes to the second hole of the support member;
  bending the leads in the second hole; and bonding the electrodes to the leads in the first holes.

A semiconductor device according to the present invention comprises:
  a semiconductor chip having electrodes;
  leads to one extremity of which the electrodes are bonded; and
  a support member supporting the leads, avoiding the other extremity,
  wherein the semiconductor chip is disposed on the side of the support member of the leads, and
  wherein the other extremity of the leads is bent so as to go around a lateral portion of the support member.

Another semiconductor device according to the present invention comprises:
  a semiconductor chip having electrodes;
  leads to one extremity of which the electrodes are bonded; and
  a support member supporting the leads, avoiding the other extremity, and having a hole,
  wherein the semiconductor chip is disposed on the side of the support member of the leads, and
  wherein the other extremity of the leads is bent into the hole in the support member.

A circuit board according to the present invention has mounted any of the above described semiconductor devices.

An electronic instrument according to the present invention has any of the above described semiconductor devices.

DETAILED DESCRIPTION OF THE EMBODIMENTS

Figure 1:
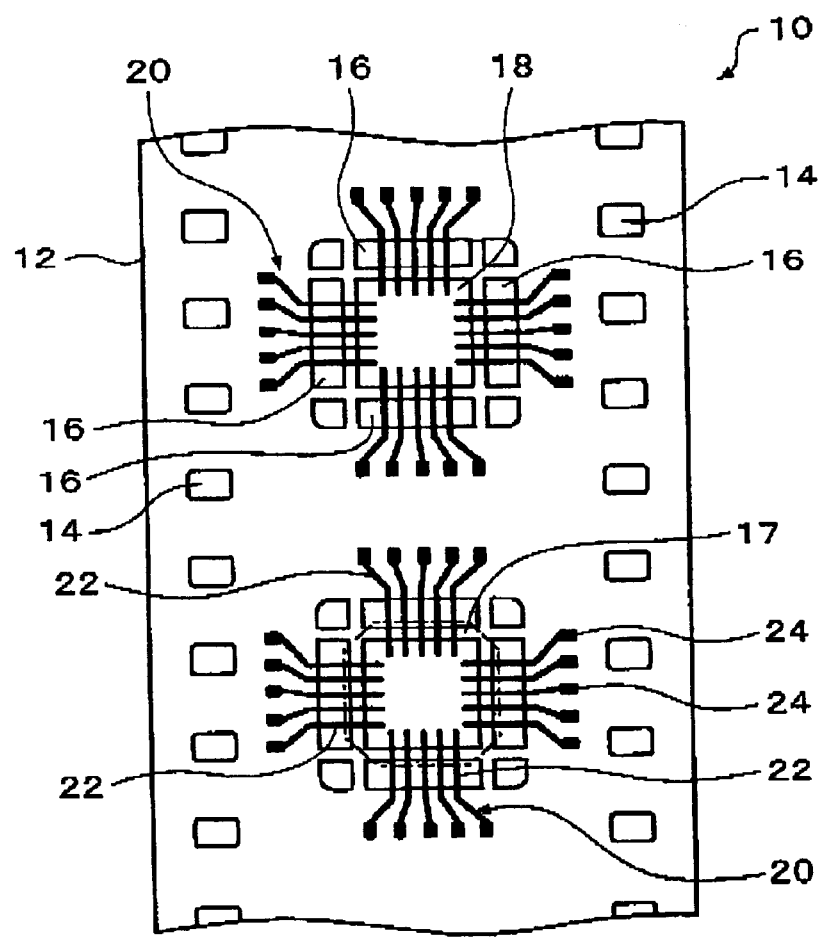
FIG. 1 shows a tape used in a first embodiment of the present invention.

Embodiments of the present invention described below can solve the above problems and provide a semiconductor device which can effectively absorb the stress, a method of manufacturing the semiconductor device, a circuit board, and an electronic instrument.

(1) According to one embodiment of the present invention, there is provided a method of manufacturing a semiconductor device comprising the steps of:

providing a semiconductor chip having electrodes to face a tape having a plurality of first holes, a support member surrounded by the first holes, and leads extending across the first holes to the support member;

bonding the electrodes to the leads;

cutting the leads in the first holes; and bending the leads to go around a lateral portion of the support member.

In this embodiment, after cutting, the leads are bent to go around a lateral portion of the support member. That is to say, external terminals are formed by bending the leads. The portion of the leads disposed at a lateral portion of the support member forms free ends, and can therefore be easily deformed. Therefore, the yielding ability of the leads with respect to externally applied stress is high, and a semiconductor device by which stress can be effectively absorbed can be manufactured.

(2) In this method of manufacturing a semiconductor device, the leads may be bent so as to sandwich the lateral portion of the support member in the bending step.

Since the leads are bent so as to sandwich the support member in this configuration, the leads can be easily deformed in a direction perpendicular to the surface of the semiconductor chip on which the electrodes are formed.

(3) In this method of manufacturing a semiconductor device, the support member may have a second hole; and the electrodes may be bonded to the leads in the second hole in the bonding step.

(4) Another method of manufacturing a semiconductor device according to one embodiment the present invention comprises the steps of:

providing a semiconductor chip having electrodes to face a tape having a plurality of first holes, a support member surrounded by the first holes and having a second hole, and leads extending across the first holes to the second hole of the support member;

bending the leads into the second hole; and bonding the electrodes to the leads in the first holes.

In this embodiment, the leads are bent into the second hole in the support member. External terminals are formed by bending the leads. The portion of the leads disposed within the second hole forms free ends, and can therefore be easily deformed. Therefore, the yielding ability of the leads with respect to externally applied stress is high, and a semiconductor device by which stress can be effectively absorbed can be manufactured.

(5) In this method of manufacturing a semiconductor device, the leads maybe bent so as to sandwich the support member from within the second hole in the bending step.

In this configuration, the leads are bent so as to sandwich the support member. Therefore, the leads are easily deformed in a direction perpendicular to the surface of the semiconductor chip on which the electrodes are formed.

(6) This method of manufacturing a semiconductor device may further comprise a step of cutting the leads in the first holes.

(7) This method of manufacturing a semiconductor device may further comprise a step of injecting a resin into the second hole after the bonding step.

For example, the surface of the semiconductor chip on which the electrodes are formed can be covered by the resin.

(8) In this method of manufacturing a semiconductor device, the outer form of the semiconductor chip may be larger than the outer form of the second hole.

(9) In this method of manufacturing a semiconductor device, the tape may have a connection portion connecting the support member to an outer frame; and the method may further comprise a step of stamping out the semiconductor chip from the tape by cutting the connection portion.

(10) This method of manufacturing a semiconductor device may further comprise a step of connecting the leads to a circuit board.

(11) According to one embodiment of the present invention, there is provided a semiconductor device comprising:

a semiconductor chip having electrodes;

leads to one extremity of which the electrodes are bonded; and a support member supporting the leads, avoiding the other extremity, wherein the semiconductor chip is disposed on the side of the leads on the support member, and wherein the other extremity of the leads is bent so as to go around a lateral portion of the support member.

According to this embodiment, one extremity of the leads is bonded to the electrodes of the semiconductor chip, and the other extremity is bent to go around a lateral portion of the support member. The semiconductor chip is disposed on the side of the leads on the support member, and the other extremity of the leads is bent on the opposite side from the semiconductor chip to form external terminals. The other extremity of the leads forms free ends, and can therefore be easily deformed. Therefore, the yielding ability of the leads with respect to externally applied stress is high, and therefore stress can be effectively absorbed.

(12) In this semiconductor device, the other extremity of the leads may be bent so as to sandwich the lateral portion of the support member.

In this configuration, the other extremity of the leads is bent so as to sandwich the support member. Therefore, the leads are easily deformed in the direction perpendicular to the surface of the semiconductor chip on which the electrodes are formed.

(13) In this semiconductor device, the support member may have a hole; and the electrodes may be bonded to the leads in the hole.

(14) Another semiconductor device according to one embodiment of the present invention comprises:

a semiconductor chip having electrodes;

leads to one extremity of which the electrodes are bonded; and a support member supporting the leads, avoiding the other extremity, and having a hole, wherein the semiconductor chip is disposed on the side of the support member of the leads, and wherein the other extremity of the leads is bent into the hole in the support member.

According to this embodiment, one extremity of the leads is bonded to the electrodes of the semiconductor chip, and the other extremity is bent in the hole in the support member. The semiconductor chip is disposed on the side of the leads on the support member, and the other extremity of the leads is bent on the opposite side from the semiconductor chip to form external terminals. The other extremity of the leads forms free ends, and can therefore be easily deformed. Therefore, the yielding ability of the leads with respect to externally applied stress is high, and therefore stress can be effectively absorbed.

(15) In this semiconductor device, the other extremity of the leads may be bent so as to sandwich the support member inside the second hole.

In this configuration, the other extremity of the leads is bent so as to sandwich the support member. The leads are easily deformed in the direction perpendicular to the surface of the semiconductor chip on which the electrodes are formed.

(16) In this semiconductor device, the electrodes may be bonded to the leads on the outside of the support member.

(17) This semiconductor device may further comprise a resin provided between the semiconductor chip and the support member; and the resin may be provided avoiding bent portions of the other extremity of the leads.

In this configuration, it can be arranged that the bent portions of the leads are not fixed by the resin. That is to say, since the leads can freely deform about the bent portions as pivot, the yielding ability of the leads with respect to externally applied stress can be further increased.

(18) In this semiconductor device, the outer form of the semiconductor chip may be larger than the outer form of the hole.

(19) According to one embodiment of the present invention, there is provided a circuit board over which any of the above described semiconductor devices is mounted.

(20) An electronic instrument according to one embodiment of the present invention has any of the above described semiconductor devices.

The embodiments of the present invention are now described below, with reference to the drawings. However, the present invention is not limited to these embodiments.
First Embodiment FIGS. 1 to 9 show a semiconductor device and a method of manufacture thereof according to a first embodiment of the present invention. It should be noted that FIGS. 6 to 9 show variants of this embodiment.

FIG. 1 is a schematic drawing showing a tape (for example a TAB tape) used in this embodiment. A tape 10 includes a base substrate 12 and a plurality of interconnecting patterns 20. Each interconnecting pattern 20 includes a plurality of leads 22. On the tape 10, a plurality of semiconductor chips (not shown in FIG. 1) may be mounted, and in this case, each semiconductor chip 30 is mounted in the region of one of the interconnecting patterns 20. It should be noted that the tape 10 may be such as to allow reel-to-reel transfer.

The base substrate 12 is commonly constituted of an organic material, but may be formed from a material including inorganic material. For example, the base substrate 12 may be a flexible substrate formed of a polyimide resin. As a flexible substrate may be used a film used in FPC (Flexible Printed Circuit) or TAB (Tape Automated Bonding) technology.

The base substrate 12 shown in FIG. 1 is in strip form, and along both edges a plurality of sprocket holes 14 is formed. The sprocket holes 14 engage with sprockets (not shown in the drawings), and the tape 10 is capable of reel-to-reel transfer.

In the example shown in FIG. 1, in the base substrate 12 are formed first holes 16 and second holes 18. The first holes 16 and second holes 18 penetrate the base substrate 12. It should be noted that as shown in the third variant described below, the second holes 18 need not be formed.

The second holes 18 may be formed one for each interconnecting pattern 20 on the tape 10. The second holes 18 may be formed approximately in the center in the width direction of the tape 10. The outer form of the second holes 18 may be a similar figure to the semiconductor chip 30, and for example, may be formed in a rectangle. The outer form of the second holes 18 may be smaller than the outer form of the semiconductor chip 30. In the second holes 18, electrodes 32 of the semiconductor chip 30 to be bonded may be exposed.

When the second holes 18 are formed, the first holes 16 may be formed adjacent to the second holes 18. As shown in FIG. 1, for each one second hole 18, a plurality (four in the drawing) of the first holes 16 maybe formed. The plurality of first holes 16 may be disposed around the periphery of the second hole 18, and when for example, as shown in FIG. 1, the second hole 18 forms a rectangle, may be formed as slots extending parallel to the sides of the rectangle.

The tape 10 has a support member 17. The support member 17 surrounds the plurality of first holes 16. The support member 17 may be formed by punching out the first holes 16.

In the example shown in FIG. 1, the second hole 18 is formed in the center of the support member 17. That is to say, the support member 17 may be formed in an elongated shape between the first holes 16 and the second hole 18. Alternatively, the second hole 18 need not be formed, and in this case, the support member 17 refers to the region of the dot-dot-dash line. The support member 17 may be formed of the same material as the base substrate 12, and for example, maybe formed of polyimide resin. In the case of the same material, the base substrate 12 includes the support member 17. Alternatively, the support member 17 may be formed as a member separate from the base substrate 12. In this case, the support member 17 may be formed of a different material from the base substrate 12. In any event, the support member 17 is connected to the outer frame of the tape 10 by connection portions 19 (see FIG. 2A).

The plurality of leads 22 constituting each interconnecting pattern 20 is commonly formed on one surface of the base substrate 12. The leads 22 may be adhered to the base substrate 12 with an adhesive material (not shown in the drawings) interposed, to form a three-layer tape. In this case, the leads 22 may be formed by etching the conductive foil on the base substrate 12. Alternatively, the leads 22 maybe formed on the base substrate 12 without an adhesive, to form a two-layer tape. For example, the leads 22 may be formed by sputtering, or an additive method may be applied in which the leads 22 are formed by electroless plating.

The leads 22 are formed to extend from the periphery of the first holes 16 and second holes 18 in the base substrate 12, crossing the first holes 16, to the support member 17. The leads 22 may be formed to extend to the second holes 18 of the support member 17. The leads 22 are supported by the support member 17. In the example shown in FIG. 1, the portion of the support member 17 between the first holes 16 and second holes 18 intersects two or more leads 22 arranged in substantially the same direction, and the support member 17 supports two or more leads 22 together. It should be noted that the leads 22 may have pads 24 for electrical test purposes formed on the base substrate 12.

Figure 2A:
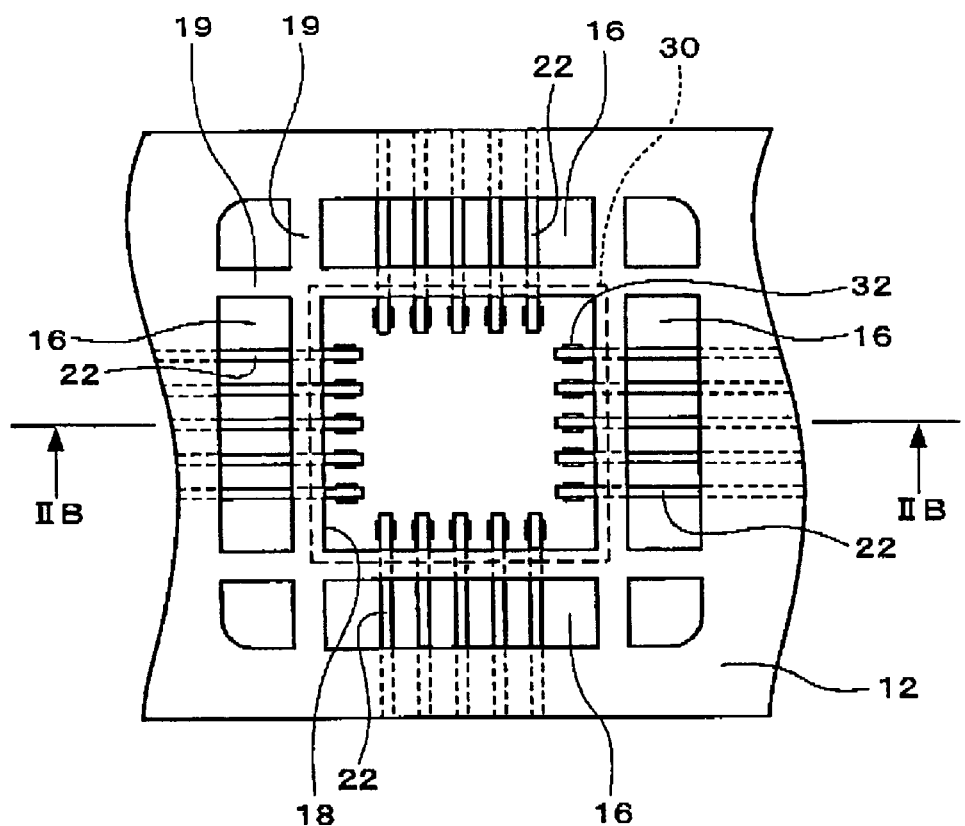
FIGS. 2A and 2B show a method of manufacturing a semiconductor device according to the first embodiment of the present invention.
Figure 2B:
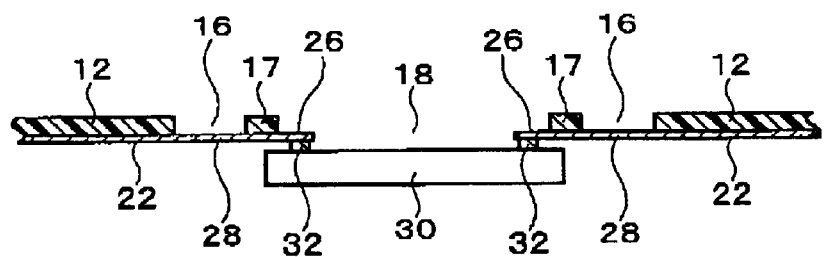

The leads 22 have portions for bonding to the electrodes 32 of the semiconductor chip 30 (for example inner leads 26), and portions to form external terminals (for example outer leads 28), and the two are connected (see FIG. 2B). In this embodiment, the inner leads 26 project into the second holes 18, and the outer leads 28 pass over the first holes 16.

The leads 22 can be formed by laminating any of copper, chromium, titanium (Ti), nickel (Ni), titanium-tungsten (Ti—W), gold (Au), aluminum (Al), nickel-vanadium (NiV), and tungsten (W), or by a single layer of any of these. The leads 22 are preferably plated with solder, tin, gold, nickel, or the like. If the metal plating is carried out to provide a eutectic mixture, a metal bond can be more easily achieved, and this is preferable.

In the following example, using the tape 10 shown in FIG. 1, a semiconductor device is fabricated.

As shown in FIGS. 2A and 2B, a semiconductor chip 10 is bonded. FIG. 2A is a plan view of the semiconductor chip mounted on the tape, and FIG. 2B is a sectional view along the line IIB—IIB shown in FIG. 2A.

The plan form of the semiconductor chip 30 is commonly a rectangle. The plurality of electrodes 32 are formed on one surface of the semiconductor chip 30. The electrodes 32 are commonly formed on the surface of the semiconductor chip 30 on which circuit elements are formed. The electrodes 32 may be formed to be aligned along at least one edge of the surface of the semiconductor chip 30, and as shown in FIG. 2A, maybe formed along the four edges of the semiconductor chip 30. The electrodes 32 have pads which are formed of aluminum or copper or the like formed to be thin and flat. The electrodes 32 may further have bumps formed on the pads. The bumps are commonly formed of gold. On the semiconductor chip 30, avoiding at least a part of the pads of the electrodes 32, a passivation layer (not shown in the drawings) is formed. The passivation layer is formed of, for example, $SiO_2$, SiN, polyimide resin, or the like.

The semiconductor chip 30 is aligned with one of the interconnecting patterns 20 on the tape 10. In more detail, the semiconductor chip 30 is disposed in the second hole 18, and the electrodes 32 are aligned with the inner leads 26 in the second holes 18. In this case, the semiconductor chip 30 is disposed on the side of the leads 22 of the support member 17. That is to say, the semiconductor chip 30 is mounted on the side of the tape 10 on which the interconnecting pattern 20 is formed.

Then in the second hole 18, the electrodes 32 and inner leads 26 are bonded. In this case, the gang bonding method, in which the plurality of leads 22 is bonded in a single operation, may be applied, or the single point bonding method, in which the leads 22 are bonded one at a time, may be applied. The bonding is carried out by applying pressure with a heated tool to the inner leads 26, within the second hole 18.

In this way, the semiconductor chip 30 can be attached to the tape 10. When a plurality of interconnecting patterns 20 is formed on the tape 10, by means of reel-to-reel transfer, a plurality of semiconductor chips 30 may be attached sequentially. By means of this, the plurality of semiconductor chips 30 can be processed in a continuous operation, and therefore the productivity is increased. It should be noted that the reel-to-reel transfer may be applied to any of the following processes carried out on the tape 10.

Figure 3A:
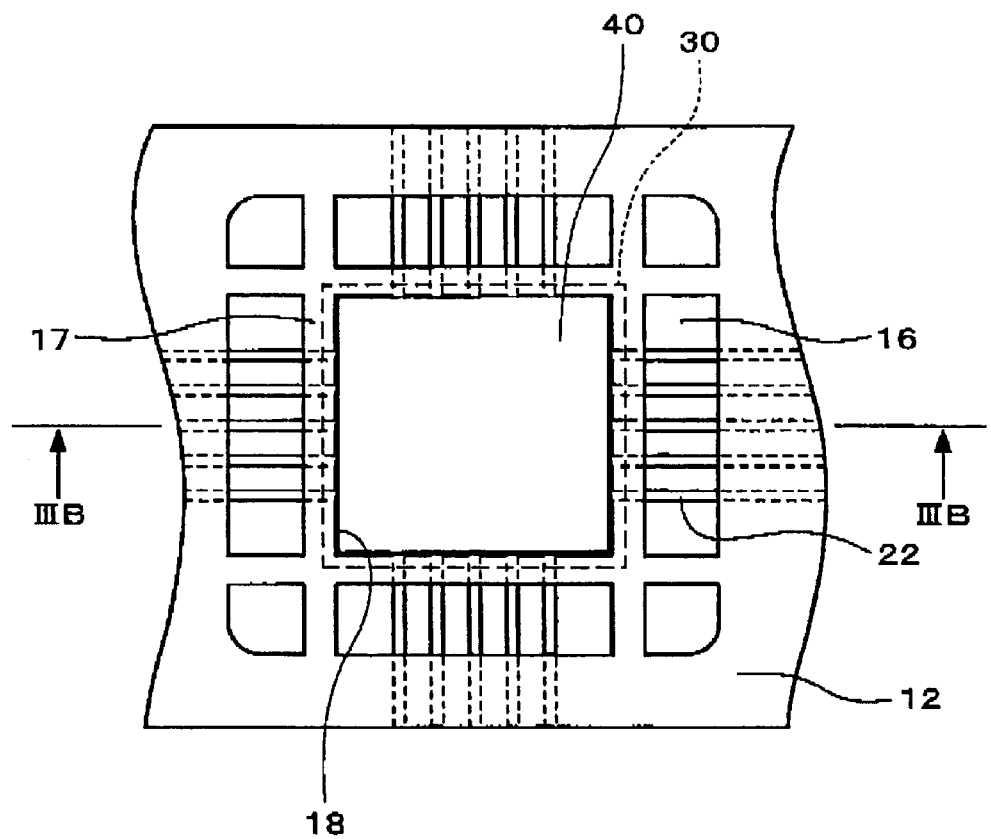
FIGS. 3A and 3B show a method of manufacturing a semiconductor device according to the first embodiment of the present invention.
Figure 3B:
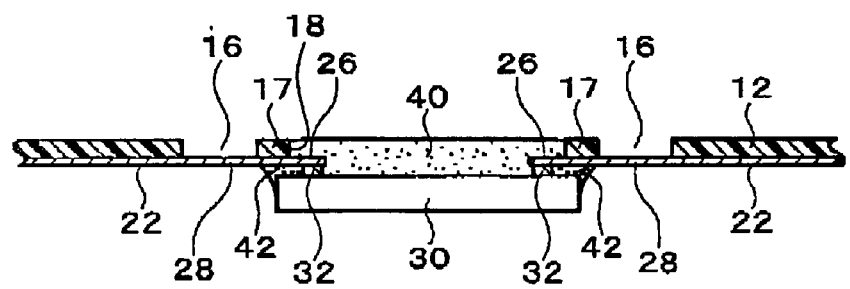

When the bonding step is completed, as shown in FIGS. 3A and 3B, a resin sealing process is carried out. That is to say, by means of a resin 40, the electrical connection portions and the like are sealed. FIG. 3A is a plan view of the resin provided on the tape, and FIG. 3B is a sectional view along the line IIIB—IIIB shown in FIG. 3A.

In this embodiment, the resin 40 is provided by potting. In more detail, within the second hole 18, on the semiconductor chip 30 is subjected to potting with the resin 40. As shown in FIG. 3A, when the outer form of the second hole 18 is smaller than the outer form of the semiconductor chip 30, the amount of the resin 40 flowing through the gap between the semiconductor chip 30 and the second hole 18 can be restricted. However, since the gap is not completely eliminated, the resin 40 can also be provided on the extremity of the semiconductor chip 30 (for example on the lateral surface or the like). It should be noted that the resin 40 may be provided to be substantially flush with the surface of the base substrate 12.

By doing this, the surface of the semiconductor chip 30 on which the electrodes 32 are formed is covered by the resin 40.

Before or after the step of providing the resin 40, a second resin (adhesive 42) may be provided on the extremity of the semiconductor chip 30. In this case, by means of the adhesive 42, the semiconductor chip 30 and support member 17 maybe fixed. The adhesive 42 may also be provided on the lateral surface of the semiconductor chip 30. By means of this, the portion in which the resin 40 does not flow can be sealed, and also the semiconductor chip 30 can be more strongly fixed to the tape 10. The resin 40 and adhesive 42 may be provided to avoid the bent portions of the leads 22 formed in the step of lead bending described below. By means of this, it is possible to ensure that the bent portions of the leads 22 are not fixed by the resin 40 or adhesive 42. That is to say, since the leads 22 can be freely deformed about the bent portions, the yielding ability of the leads 22 with respect to externally applied stress can be increased.

Figure 4A:
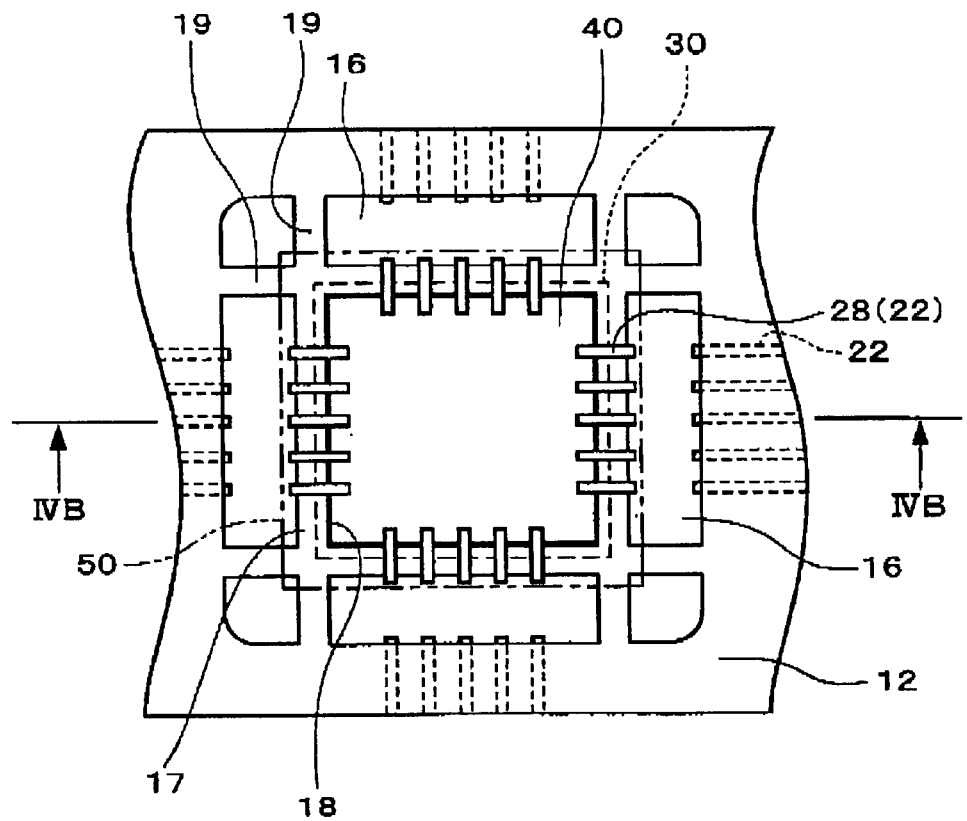
FIGS. 4A and 4B show a method of manufacturing a semiconductor device according to the first embodiment of the present invention.
Figure 4B:
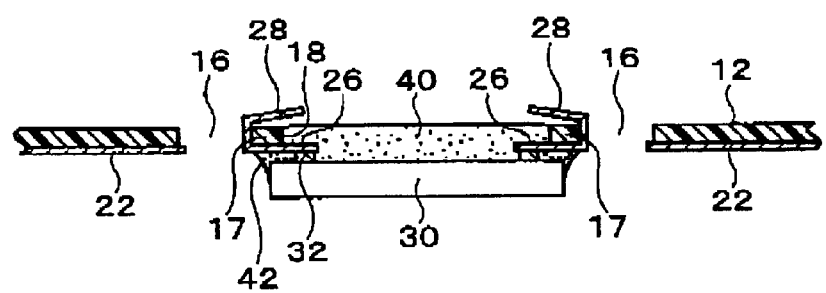

As shown in FIGS. 4A and 4B, steps of cutting and bending the leads are carried out. These steps may be carried out after the bonding step, and may be carried out after the resin sealing process. It should be noted that FIG. 4A is a plan view after the after the leads have been cut and bent, and FIG. 4B is a sectional view along the line IVB—IVB shown in FIG. 4A.

First, the leads 22 are cut, making the outer leads 28 into free ends. In more detail, the leads 22 are cut within the first holes 16. As shown in the drawing, the cutting may be done at the extremity of the first holes 16, or if the sufficient length required for bending can be obtained, the cutting may be done in a central portion. If the leads 22 are cut within the first holes 16, the semiconductor chip 30 is fixed to the outer frame of the tape 10 by the connection portions 19.

Next, the leads 22 are bent, and the outer leads 28 are disposed on the opposite side from the semiconductor chip 30. In more detail, of the leads 22 after cutting, the portions remaining supported by the support member 17 within the first holes 16 are bent to go around the lateral portion of the support member 17. It should be noted that the portion of the leads 22 disposed on the lateral portion of the support member 17 may be fixed to the support member 17 by the resin 40 or adhesive 42, but need not be fixed. If not fixed, the flexibility of deformation of the leads 22 can be increased.

In FIGS. 4A and 4B, the outer leads 28 are bent to sandwich the lateral portion of the support member 17. In other words, the outer leads 28 are bent back to the central side of the semiconductor chip 30. In this case, in order to bend without severing, the leads 22 may be bent in an arc at the lateral portion of the support member 17. By means of this, since the leads 22 are bent so as to sandwich the support member 17, the leads 22 can be made more easily deformed in the direction perpendicular to the surface of formation of the electrodes 32 of the semiconductor chip 30. That is to say, even if external stress is applied to the semiconductor device, since the outer leads 28 yield to this stress and deform, the stress can be effectively absorbed.

The ends of the outer leads 28 may extend as far as the resin 40 (second hole 18). The plurality of leads 22 is preferably bent in such a way the leads 22 are of substantially the same form. By means of this, the planarity of the plurality of external terminals (outer leads 28) can be ensured.

After the bonding step, a step of stamping out the semiconductor chip 30 may be carried out. That is to say, individual semiconductor chips 30 on the tape 10 are separated. For example, as shown in FIG. 4A, in a region 50 delimited by a dot-dot-dash line including the semiconductor chip 30, the semiconductor chip 30 may be stamped out from the tape 10. More concretely, by cutting the connection portions 19 fixing the semiconductor chip 30 on the tape 10, the individual semiconductor chips 30 can be separated.

The step of stamping out the semiconductor chip 30 may be carried out after the cutting and bending processes on the leads 22. By means of this, after carrying out the processes of cutting and bending on the leads 22 by application of reel-to-reel transfer, the individual semiconductor chips 30 are separated, as a result of which the productivity is excellent. Alternatively, this step may be carried out after the step of cutting the leads 22 and before the step of bending, or before the step of cutting the leads 22.

According to this method of manufacture of a semiconductor device, the leads 22 are bonded within the second hole 18, and after cutting, the leads 22 are bent so as to go around from the first holes 16 to the lateral portion of the support member 17. The semiconductor chip 30 is disposed on the side of leads 22 on the support member 17, and the leads 22 are bent toward the support member 17, whereby the external terminals are formed. The portions of the leads 22 disposed on the lateral portion of the support member 17 form free ends, and are therefore easily deformed. Therefore, the yielding ability of the leads 22 with respect to externally applied stress is high, and a semiconductor device can be manufactured in which stress can be effectively absorbed.

Moreover, if the tape 10 is subjected to reel-to-reel transfer as the various processes are carried out, a plurality of semiconductor devices can be manufactured in a continuous operation, and therefore the productivity can be increased.

Figure 5:
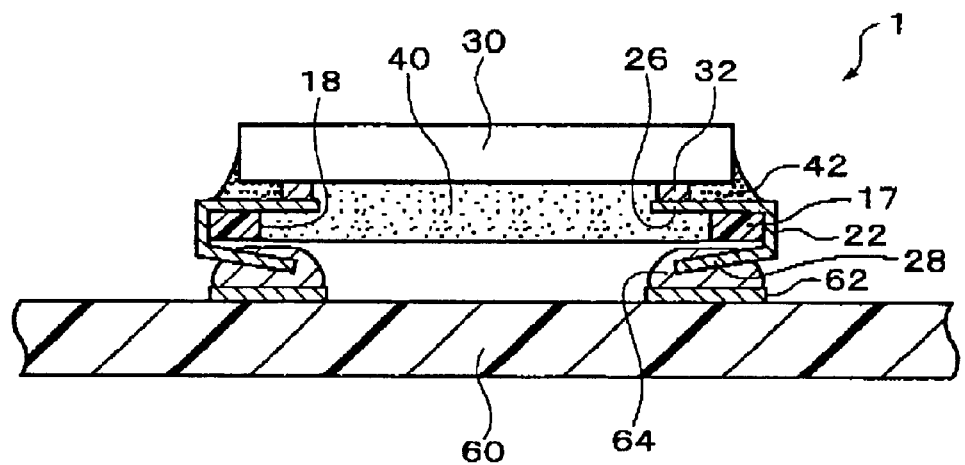
FIG. 5 shows a semiconductor device according to the first embodiment of the present invention.

In this way, as shown in FIG. 5, the semiconductor device can be manufactured. A semiconductor device 1 includes the semiconductor chip 30 having electrodes 32, leads 22 bonded to the electrodes 32, and the support member 17 of the leads 22. It should be noted that this embodiment of a semiconductor device includes the structure implied by the above described method of manufacture.

The semiconductor chip 30 is disposed on the side of the support member 17 of the leads 22, and the electrodes 32 are bonded to the inner leads 26 (one extremity of the leads 22). The outer leads 28 (the other extremity of the leads 22) are bent so as to go around the lateral portion of the support member 17 on the opposite side from the semiconductor chip 30. The outer leads 28 form free ends from the support member 17.

The support member 17 may have the hole 18 in a central portion. In other words, the support member 17 may be formed as a frame with a constant width. The outer form of the hole 18 may be larger than the outer form of the semiconductor chip 30, or may be smaller. The support member 17 supports the leads 22 avoiding at least the outer leads 28. As shown in FIG. 5, the inner leads 26 may project into the hole 18. That is to say, the support member 17 may support the leads 22 also avoiding the inner leads 26. By forming the support member 17 in the form of a frame, the plurality of leads 22 extending to the hole 18 can be supported in a single operation. It should be noted that the hole 18 of the support member 17 may be formed of a size such as to expose the electrodes on the semiconductor chip 30.

In the example shown in FIG. 5, the outer leads 28 are bent toward the center of the semiconductor chip 30, so as to sandwich the lateral portion of the support member 17. By means of this, the leads 22 can be easily deformed in a direction perpendicular to the surface of the semiconductor chip 30 on which the electrodes 32 are formed.

The semiconductor chip 30 may be provided with the resin 40, and the extremity of the semiconductor chip 30 may be provided with the adhesive 42. These measures are as described in the above described method of manufacture.

In the example shown in FIG. 5, the semiconductor device 1 is mounted on a circuit board 60. For the circuit board 60 is generally used, for example, an organic substrate such as a glass epoxy substrate or the like. On the circuit board 60, an interconnecting pattern 62 is formed to constitute a desired circuit, and the parts of the interconnecting pattern 62 and the outer leads 28 of the semiconductor device 1 are electrically connected. As shown in FIG. 5, the outer leads 28 and the interconnecting pattern 62 may be electrically connected by solder 64. In this case, without forming solder balls, when the semiconductor device 1 is mounted a solder cream applied to the circuit board 60 may be used, and when this is melted the electrical connection achieved by surface tension. By means of this, the step of forming solder balls on the outer leads 28 can be omitted, and therefore the manufacturing process can be made simpler while the manufacturing cost is reduced. Since the solder is used at the mounting stage, the process of manufacturing the semiconductor device is not subject to customer requirements for the type of solder ball (for example specifying lead-free solder).

According to this semiconductor device, one extremity of the leads 22 (the inner leads 26) is bonded to the electrodes 32 of the semiconductor chip 30, and the other extremity (the outer leads 28) is bent to go around the lateral portion of the support member 17. The semiconductor chip 30 is disposed on the side of the leads 22 on the support member 17, and the other extremity of the leads 22 is bent on the opposite side from the semiconductor chip 30 to form external terminals. Since the other extremities of the leads 22 form free ends, they are easily deformed. That is to say, with respect to externally applied stress the yielding ability of the leads 22 is high, and therefore stress can be effectively absorbed.

Furthermore, since the other extremity of the leads 22 is bent to go around the lateral portion of the support member 17, the handling of the semiconductor device is easy, and damage to the leads 22, or bending, or the like can be prevented. Therefore, a semiconductor device can be provided to support increasingly narrow pitch. It should be noted that this semiconductor device has the same effect as described in the above described method of manufacture.

(First Variant)

Figure 6:
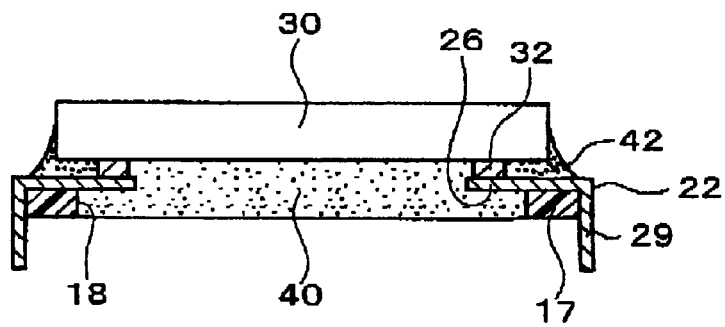
FIG. 6 shows a semiconductor device according to a first variant of the first embodiment of the present invention.

FIG. 6 shows the semiconductor device according to a first variant of this embodiment. In this variant, the form of the leads 22 is different from the description above. As shown in FIG. 6, outer leads 29 may be bent in the direction away from the surface of the semiconductor chip 30. That is to say, the leads 22 may be formed in an L-shape. In this case also, the outer leads 29 form free ends, and therefore the above described effect can be achieved. Furthermore, when the L-shaped bent portions are exposed from the resin 40 or adhesive 42, since the leads 22 can deform freely about the bent portions as pivot, the yielding ability of the leads 22 with respect to externally applied stress can be further increased.

(Second Variant)

Figure 7:
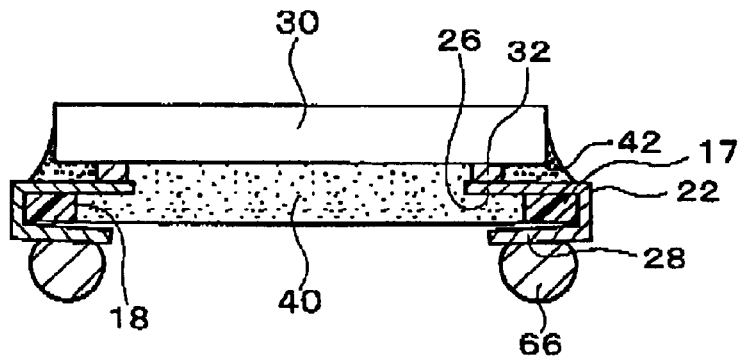
FIG. 7 shows a semiconductor device according to a second variant of the first embodiment of the present invention.

FIG. 7 shows a semiconductor device according to a second variant of this embodiment. In this variant, the outer leads 28 are provided with solder balls 66. To form the solder balls 66, with the outer leads 28 in a raised formed solder cream may be provided, and this may be fused in a reflow process to form balls. In this case also, the outer leads 28 form free ends, and therefore stress applied to the solder balls 66 can be effectively absorbed.

(Third Variant)

Figure 8:
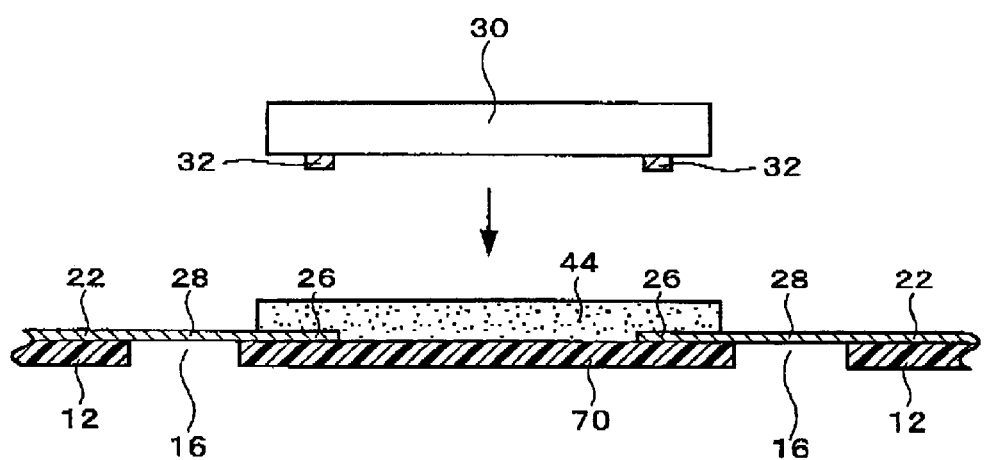
FIG. 8 shows a semiconductor device according to a third variant of the first embodiment of the present invention.
Figure 9:
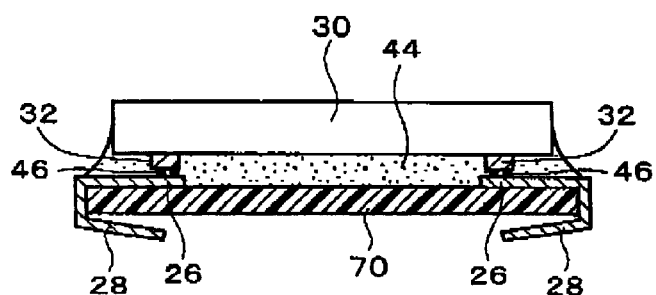
FIG. 9 shows the semiconductor device according to the third variant of the first embodiment of the present invention.

FIGS. 8 and 9 show a semiconductor device and method of manufacture thereof according to a third variant of this embodiment. In this variant, the form of a support member 70 is different from that described above. In more detail, using a tape having the support member 70 in which holes are not formed, the semiconductor device is manufactured. In this case, tape may be, for example, a tape for COF.

As shown in FIG. 8, the semiconductor chip 30 is mounted on the support member 70. For example, after a resin 44 is provided on the support member 70 (or semiconductor chip 30), by applying pressure to the semiconductor chip 30, the semiconductor chip 30 and support member 70 may be fixed. Alternatively, after mounting the semiconductor chip 30 on the support member 70, the resin 44 may be injected between the two as an underfill material.

The form of bonding of the electrodes 32 of the semiconductor chip 30 and the leads 22 (inner leads 26) includes conductive resin paste, a metal bond such as Au—Au, Au—Sn, solder or the like, or bonding by the contraction force of insulating resin or the like, and any of these forms maybe used. For example, as shown in FIGS. 8 and 9, an adhesive 44 (anisotropic conducting material) having conductive particles 46 may be used, and by interposing the conductive particles 46 between the electrodes 32 and the inner leads 26 the two may be electrically connected. It should be noted that for the steps of cutting and bending the leads, the content of the above description can be applied.

The resin 44 may be provided to avoid the bent portions of the leads 22 formed in the step of lead bending. By means of this, the bent portions of the leads 22 can be made so as not to be fixed by the resin 44. That is to say, since the leads 22 can freely deform about the bent portions as pivot, the yielding ability of the leads 22 with respect to externally applied stress can be increased.

In this way, the semiconductor device shown in FIG. 9 is manufactured. It should be noted that this semiconductor device includes the structure implied by the method of manufacture, and the above described effect can be achieved.

Second Embodiment

FIGS. 10A to 12 show a semiconductor device and method of manufacture thereof according to a second embodiment of the present invention. In this embodiment, as far as possible the content described in the first embodiment can be applied.

Figure 10A:
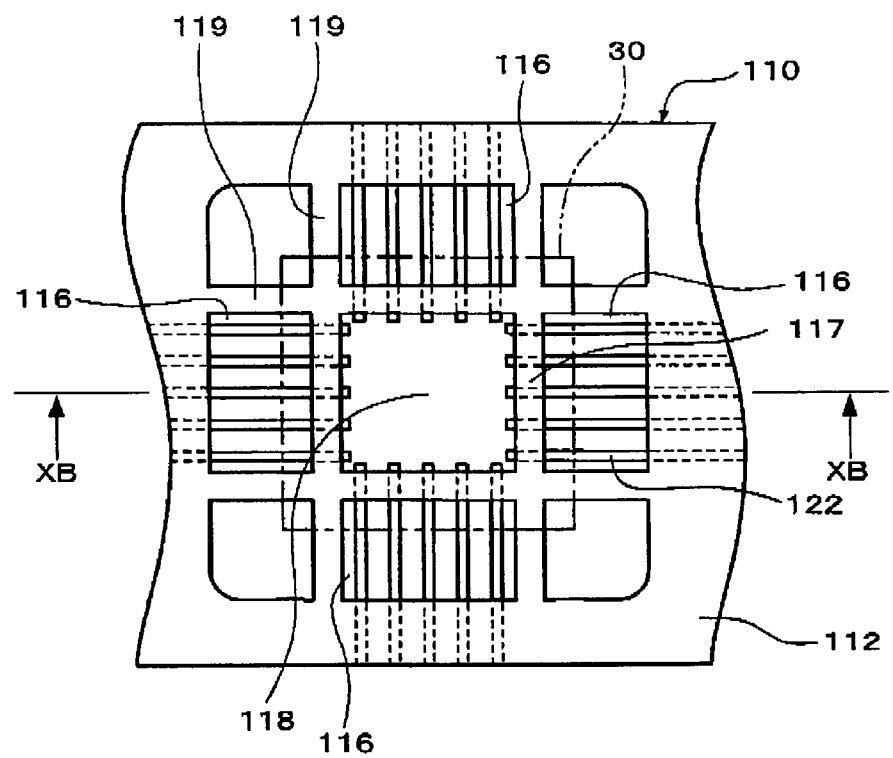
FIGS. 10A and 10B show a method of manufacturing a semiconductor device according to a second embodiment of the present invention.
Figure 10B:
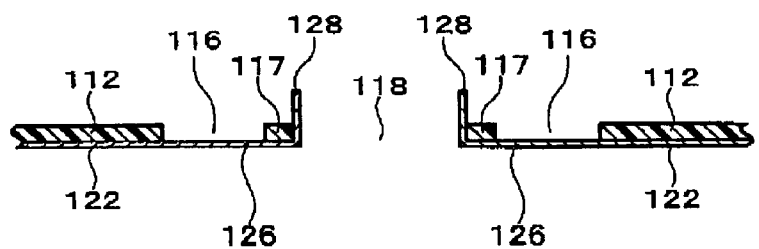

FIG. 10A is a plan view of a tape used in this embodiment. FIG. 10B is a sectional view along the line XB—XB shown in FIG. 10A. A tape 110 includes a base substrate 112 and a plurality of interconnecting patterns (including a plurality of leads 122). In more detail, the tape 110 comprises first holes 116, support members 117 surrounding the first holes 116 and having second holes 118, and leads 122 crossing the first holes 116 and extending as far as the second holes 118 of the support members 117. The support member 117 may be formed of the same material as the base substrate 112, of maybe formed as a separate member of a different material. In the former case, the base substrate 112 includes the support member 117.

In this embodiment, the outer form of the second holes 118 is smaller than the outer form of the semiconductor chip 30. It should be noted that support member 117 is connected to the outer frame of the tape 110 by a connection portion 119.

In this embodiment, the leads 122 project further into the second holes 118 than in the first embodiment. The leads 122 have portions to be bonded to the electrodes 32 of the semiconductor chip 30 (for example the inner leads 126) and portions to form external terminals (for example the outer leads 128), and both are connected. Then in this embodiment, the portions including the inner leads 126 pass over the first holes 116, and the outer leads 128 project into the second holes 118. In the first holes 116, the electrodes 32 of the semiconductor chip 30 to be bonded are exposed. For the remainder of the construction of the tape 110, any construction described in the first embodiment can selectively be applied. It should be noted that FIGS. 10A and 10B show the state with the outer leads 128 bent in the direction away from the semiconductor chip 30.

First, as shown in FIGS. 10A and 10B, of the leads 122, the portions projecting into the second hole 118 are bent inside the second hole 118 of the support member 117. That is to say, the leads 122 are bent so as to pass in the direction penetrating the second hole 118. For example, as shown in FIG. 10B, they may be bent to stand up in the direction away from the surface of the semiconductor chip 30 to be mounted. That is to say, the leads 122 may be bent in an L-shape. The leads 122 project into the second hole 118 with a particular length for the purpose of bending, and therefore if the leads 122 are bent in advance, contact between leads 122 extending in different directions can be prevented. Therefore, damage to the leads 122 can be prevented.

Figure 11A:
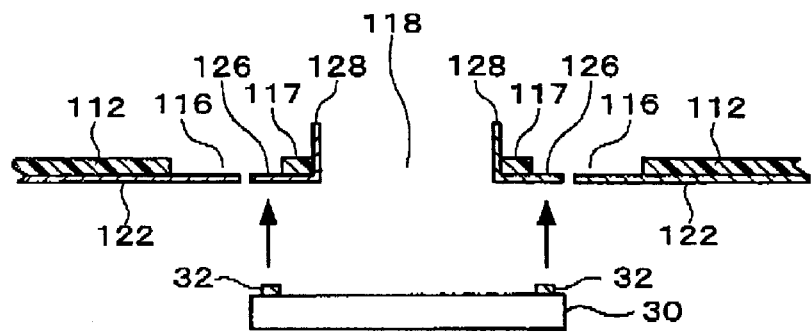
FIGS. 11A and 11B show a method of manufacturing a semiconductor device according to the second embodiment of the present invention.
Figure 11B:
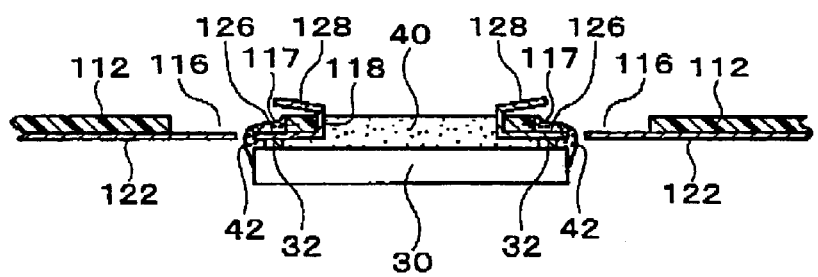

Alternatively, in distinction from the example shown in the drawing, the leads 122 may be first bent so as to sandwich the support member 117 on the inside of the second hole 118 (see FIG. 11B).

As shown in FIG. 11A, the step of cutting the leads is carried out. In more detail, the leads 122 are cut inside the first holes 116. The leads 122 are cut with the portion (inner leads 26) to be bonded to the electrodes 32 of the semiconductor chip 30 supported by the support member 117. In this case, the cut is preferably positioned so that the extremity of the leads 122 after cutting does not project from the periphery of the semiconductor chip 30 to be mounted. If the step of cutting the leads is carried out before the bonding step, the leads 122 can be cut without being limited by the outer form of the semiconductor chip 30, and therefore projection of the leads 122 from the periphery of the semiconductor chip 30 can be simply prevented. It should be noted that if the leads 122 are cut within the first holes 116, the semiconductor chip 30 is fixed to the outer frame of the tape 110 by the connection portion 119.

In the example shown in FIG. 1A, after the step of cutting the leads, the bonding step of the semiconductor chip is carried out. That is to say, in the first holes 116, the electrodes 32 and the inner leads 126 are bonded. In this case, the single point bonding method may be applied.

Alternatively, the bonding step may be carried out before the step of cutting the leads. In this case, the electrodes 32 and a portion of the leads 122 extending over the first holes 116 (inner leads 126) are bonded. Then after the bonding step is completed, the above described step of cutting the leads may be carried out.

As shown in FIG. 11B, after completion of the bonding step, the step of lead bending may be carried out. In FIG. 11B, the outer leads 128 are bent toward the side of the extremity of the semiconductor chip 30 so as to sandwich the support member 117 from the inside. By means of this, the leads 122 can be easily deformed in a direction perpendicular to the surface of the semiconductor chip 30 on which the electrodes 32 are formed.

After completion of the bonding step, a resin sealing step may be carried out. For example, within the second hole 118, on the semiconductor chip 30 is subjected to potting with the resin 40. In this embodiment, since the outer form of the second hole 118 is smaller than the outer form of the semiconductor chip 30, the amount of the resin 40 flowing from the gap between the semiconductor chip 30 and the second hole 118 can be limited. However, since the gap is not entirely nonexistent, the resin 40 can also be provided on the extremity of the semiconductor chip 30 (for example a lateral surface or the like). Furthermore, as required, the adhesive 42 may be provided on the extremity of the semiconductor chip 30.

The portion of the leads 122 disposed within the second hole may be fixed to the support member 117 by the resin 40 or adhesive 42, but may equally not be fixed. If not fixed, the freedom of deformation of the leads 122 can be increased. Furthermore, the resin 40 and adhesive 42 may be provided to avoid the bent portions of the leads 122. By means of this, it can be arranged that the bent portions of the leads 122 are not fixed by the resin 40 or adhesive 42. That is to say, since the leads 122 can freely deform about the bent portions as pivot, the yielding ability of the leads 122 with respect to externally applied stress can be increased.

After completion of the bonding step, a step of stamping out the semiconductor chip 30 may be carried out. The above described steps may be carried out by reel-to-reel transfer.

In this embodiment of a method of manufacture of a semiconductor device again, the effect described in the first embodiment can be achieved. It should be noted that other aspects of the above described description are as described in the first embodiment.

Figure 12:
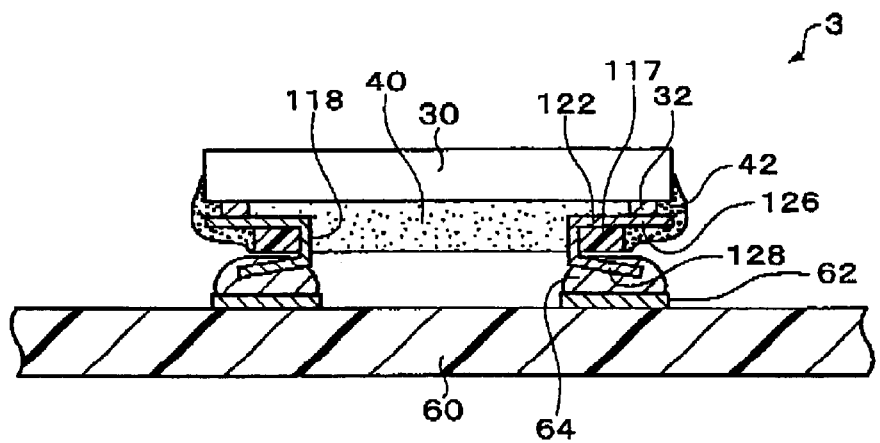
FIG. 12 shows a semiconductor device according to the second embodiment of the present invention.

FIG. 12 shows the semiconductor device according to this embodiment. This semiconductor device includes the semiconductor chip 30 having electrodes 32, leads 122 bonded to the electrodes 32, and the support member 117 of the leads 122. The electrodes 32 maybe bonded to the leads 22 (inner leads 126) on the outside of the support member 117. It should be noted that this embodiment of a semiconductor device includes the construction implied by the above described method of manufacture.

The support member 117 may in a central portion have the hole 118, and the outer form of the hole 118 may be smaller than the outer form of the semiconductor chip 30. The support member 117, as described in the above described embodiment, may be in the form of a frame having a constant width.

In the example shown in FIG. 12, the outer leads 128 are bent in a direction of the extremity of the semiconductor chip 30, so as to sandwich the support member 117 from the inside of the hole 118. By means of this, the leads 122 can easily be deformed in a direction perpendicular to the surface of the semiconductor chip 30 on which the electrodes 32 are formed. On the semiconductor chip 30, the resin 40 and adhesive 42 may be provided. In FIG. 12, the semiconductor device is mounted on the circuit board 60.

In the semiconductor device of this embodiment also, the effect described for the first embodiment can be achieved. It should be noted that the other construction of the above described description are as described in the first embodiment.

In this embodiment also, the variants described in the first embodiment can be applied. That is to say, the outer leads 128 may be formed in an L-shape, or solder balls may be formed on the outer leads 128.

Figure 13:
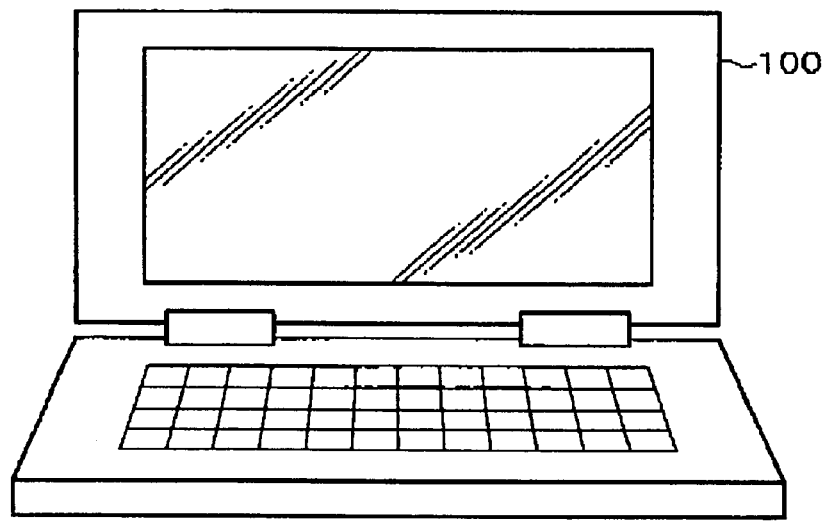
FIG. 13 shows an electronic instrument having a semiconductor device according to one embodiment of the present invention.
Figure 14:
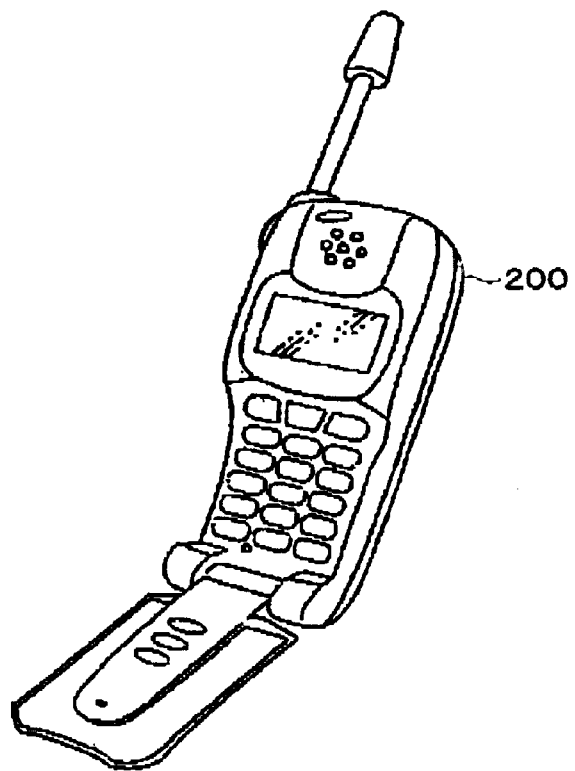
FIG. 14 shows an electronic instrument having a semiconductor device according to one embodiment of the present invention.

As an electronic instrument having the semiconductor device to which the present invention is applied, FIG. 13 shows a notebook personal computer 100, and FIG. 14 shows a mobile telephone 200.

What is claimed is:

1. A semiconductor device comprising:

a semiconductor chip having electrodes on a surface thereof;

leads, the electrodes being bonded to first extremities of the leads; and a support member supporting the leads, second extremities of the leads extending away from the support member, the second extremities extending in a direction along a path that leads away from the surface of the semiconductor chip upon which the electrodes are located, wherein the semiconductor chip is disposed on the side of the leads on the support member, and wherein the leads are bent so as to go around a lateral portion of the support member.

2. The semiconductor device as defined in claim 1, wherein the leads are bent so as to sandwich the lateral portion of the support member.

3. A semiconductor device comprising:

a semiconductor chip having electrodes;

leads, the electrodes being bonded to first extremities of the leads; and a support member supporting the leads, second extremities of the leads extending away from the support member, wherein:
the semiconductor chip is disposed on the side of the leads on the support member;
the leads are bent so as to go around a lateral portion of the support member;
the support member has a penetrating hole; and
the electrodes are bonded to the leads inside the penetrating hole.

4. A semiconductor device comprising:

a semiconductor chip having electrodes;

leads, the electrodes being bonded to first extremities of the leads; and a support member supporting the leads and having a penetrating hole, second extremities of the leads extending away from the support member, wherein the semiconductor chip is disposed on the side of the leads on the support member, and wherein the leads extend outward through the penetrating hole from the electrodes.

5. The semiconductor device as defined in claim 4, wherein the leads are bent so as to sandwich the support member inside the penetrating hole.

6. The semiconductor device as defined in claim 4, wherein the electrodes are bonded to the leads on the outside of the support member.

7. A semiconductor device comprising:

a semiconductor chip having electrodes;

leads, the electrodes being bonded to first extremities of the leads; and a support member supporting the leads, second extremities of the leads extending away from the support member; and a resin provided between the semiconductor chip and the support member, wherein the semiconductor chip is disposed on the side of the leads on the support member, the leads are bent so as to go around a lateral portion of the support member, and the resin is provided avoiding bent portions of the leads.

8. The semiconductor device as defined in claim 4, further comprising:

a resin provided between the semiconductor chip and the support member, wherein the resin is provided avoiding bent portions of the leads.

9. The semiconductor device as defined in claim 3, wherein the outer form of the semiconductor chip is larger than the outer form of the penetrating hole.

10. The semiconductor device as defined in claim 4, wherein the outer form of the semiconductor chip is larger than the outer form of the penetrating hole.

11. A circuit board over which is mounted the semiconductor device as defined in claim 1.

12. A circuit board over which is mounted the semiconductor device as defined in claim 4.

13. An electronic instrument having the semiconductor device as defined in claim 1.

14. An electronic instrument having the semiconductor device as defined in claim 4.

* * * * *